US011003097B2

(12) United States Patent
Lin et al.

(10) Patent No.: US 11,003,097 B2
(45) Date of Patent: *May 11, 2021

(54) IMMERSION LITHOGRAPHY SYSTEM USING A SEALED WAFER BATH

(71) Applicant: Taiwan Semiconductor Manufacturing Company, Ltd., Hsin-Chu (TW)

(72) Inventors: Burn Jeng Lin, HsinChu (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/721,313

(22) Filed: Dec. 19, 2019

(65) Prior Publication Data

US 2020/0124992 A1 Apr. 23, 2020

Related U.S. Application Data

(63) Continuation of application No. 16/217,095, filed on Dec. 12, 2018, now Pat. No. 10,520,836, which is a
(Continued)

(51) Int. Cl.
*G03B 27/42* (2006.01)
*G03F 7/20* (2006.01)

(52) U.S. Cl.
CPC ...... *G03F 7/70866* (2013.01); *G03F 7/70341* (2013.01)

(58) Field of Classification Search
CPC ...... G03F 7/70341; G03F 7/20; G03F 7/2037; G03F 7/70358; G03F 7/706;
(Continued)

(56) References Cited

U.S. PATENT DOCUMENTS 5,610,683 A 3/1997 Takahashi
6,788,477 B2 9/2004 Lin
(Continued)

FOREIGN PATENT DOCUMENTS

CN 1490673 4/2004
CN 1501175 6/2004
(Continued)

OTHER PUBLICATIONS

Burn Jeng Lin, "Immersion Lithography Ssytem Using a Sealed Wafer Bath," U.S. Appl. No. 11/670,860, filed Feb. 2, 2007, 32 pages.
(Continued)

*Primary Examiner* — Mesfin T Asfaw
(74) *Attorney, Agent, or Firm* — Haynes and Boone, LLP (57) ABSTRACT

Immersion lithography system and method using a sealed wafer bottom are described. One embodiment is an immersion lithography apparatus comprising a lens assembly comprising an imaging lens and a wafer stage for retaining a wafer beneath the lens assembly, the wafer stage comprising a seal ring disposed on a seal ring frame along a top edge of the wafer retained on the wafer stage, the seal ring for sealing a gap between an edge of the wafer and the wafer stage. The embodiment further includes a fluid tank for retaining immersion fluid, the fluid tank situated with respect to the wafer stage for enabling full immersion of the wafer retained on the wafer stage in the immersion fluid and a cover disposed over at least a portion of the fluid tank for providing a temperature-controlled, fluid-rich environment within the fluid tank.

20 Claims, 14 Drawing Sheets

Related U.S. Application Data continuation of application No. 15/639,272, filed on Jun. 30, 2017, now Pat. No. 10,168,625, which is a continuation of application No. 14/727,278, filed on Jun. 1, 2015, now Pat. No. 9,696,634, which is a continuation of application No. 13/595,734, filed on Aug. 27, 2012, now Pat. No. 9,046,789, which is a continuation of application No. 11/671,046, filed on Feb. 5, 2007, now Pat. No. 8,253,922.

(60) Provisional application No. 60/864,241, filed on Nov. 3, 2006.

(58) Field of Classification Search
CPC .............. G03F 9/7026; G03F 7/70258; G03F 7/70641; G03F 9/7096; G03F 7/327; G03F 7/70558
See application file for complete search history.

(56) References Cited

U.S. PATENT DOCUMENTS

| | | |
|---|---|---|
| 7,075,616 B2 | 7/2006 | Derksen et al. |
| 7,091,502 B2 | 8/2006 | Gau et al. |
| 7,199,858 B2 | 4/2007 | Lof et al. |
| 7,213,963 B2 | 5/2007 | Lof et al. |
| 7,304,715 B2 | 12/2007 | Cadee et al. |
| 7,349,064 B2 | 3/2008 | Nakano |
| 7,379,162 B2 | 5/2008 | Miyajima |
| 7,397,533 B2 | 7/2008 | Verhagen et al. |
| 7,483,119 B2 | 1/2009 | Owa et al. |
| 7,501,226 B2 | 3/2009 | Lin et al. |
| 7,932,991 B2 | 4/2011 | Nagasaka et al. |
| 7,986,395 B2 | 7/2011 | Chang et al. |
| 8,004,650 B2 | 8/2011 | Hirukawa et al. |
| 8,035,797 B2 | 10/2011 | Tani et al. |
| 8,208,116 B2 | 6/2012 | Lin et al. |
| 8,253,922 B2 | 8/2012 | Lin et al. |
| 9,046,789 B2 | 6/2015 | Lin et al. |
| 2004/0075895 A1 | 4/2004 | Lin |
| 2004/0160582 A1 | 8/2004 | Lof et al. |
| 2004/0211920 A1 | 10/2004 | Derksen et al. |
| 2004/0263809 A1 | 12/2004 | Nakano |
| 2005/0122505 A1 | 6/2005 | Miyajima |
| 2005/0219488 A1 | 10/2005 | Nei et al. |
| 2005/0253090 A1 | 11/2005 | Gau et al. |
| 2005/0259234 A1 | 11/2005 | Hirukawa et al. |
| 2005/0264778 A1 | 12/2005 | Lof et al. |
| 2005/0286033 A1 | 12/2005 | Lin et al. |
| 2006/0033892 A1 | 2/2006 | Cadee et al. |
| 2006/0119809 A1 | 6/2006 | Verhagen et al. |
| 2006/0146306 A1 | 7/2006 | Nagasaka et al. |
| 2006/0232757 A1 | 10/2006 | Tani et al. |
| 2007/0091287 A1 | 4/2007 | Chang et al. |
| 2007/0177125 A1 | 8/2007 | Shibazaki |
| 2008/0106710 A1 | 5/2008 | Lin et al. |
| 2008/0106715 A1 | 5/2008 | Lin et al. |
| 2008/0304025 A1 | 12/2008 | Chang |
| 2015/0261103 A1 | 9/2015 | Lin et al. |
| 2017/0299968 A1 | 10/2017 | Lin et al. |

FOREIGN PATENT DOCUMENTS

| | | |
|---|---|---|
| CN | 1746775 | 3/2006 |
| CN | 1501172 | 4/2009 |
| JP | 6124873 | 5/1994 |
| JP | 2005005707 | 6/2005 |
| JP | 2005166776 | 6/2005 |
| JP | 2006165562 | 6/2006 |
| JP | 2006190996 | 7/2006 |
| WO | WO2005/024517 | 3/2005 |

OTHER PUBLICATIONS

Ching-Yu Chang, "Apparatus and Method for Immersion Immersion Lithography," U.S. Appl. No. 11/760,365, filed Jun. 8, 2007, 22 pages.

Japanese Patent Office, Office Action dated Jan. 4, 2011, Application No. 2007-245245, 5 pages.

Japanese Patent Office, Final Notice of Reasons for Refusal dated Jan. 4, 2011, Application No. 2007-245245, 5 pages.

Japanese Patent Office, Office Action issued Jun. 28, 2010, Application No. 2007-245245, 6 pages.

Chinese Patent Office, Office Action dated Feb. 20, 2009, Application No. 2007101531915, 8 pages.

Chinese Patent Office, Office Action dated Feb. 20, 2009, Application No. 2007101531900, 4 pages.

Dutch Patent Office, Written Opinion and Search Report dated Dec. 2, 2009, Application No. 1034411, 8 pages.

Dutch Patent Ofice, Written Opinion and Search Report dated Dec. 2, 2009, Application No. 1034412, 7 pages.

IMMERSION LITHOGRAPHY SYSTEM USING A SEALED WAFER BATH

PRIORITY DATA

The present application is a continuation application of U.S. patent application Ser. No. 16/217,095, filed Dec. 12, 2018, which is a continuation application of U.S. patent application Ser. No. 15/639,272, filed Jun. 30, 2017, which is a continuation application of U.S. patent application Ser. No. 14/727,278, filed Jun. 1, 2015, which is a continuation of U.S. patent application Ser. No. 13/595,734, filed Aug. 27, 2012, issued as U.S. Pat. No. 9,046,789, which is a continuation of U.S. patent application Ser. No. 11/671,046, filed Feb. 5, 2007, issued as U.S. Pat. No. 8,253,922, which claims priority from U.S. provisional patent application No. 60/864,241, filed on Nov. 3, 2006, each of which is hereby incorporated by reference in its entirety.

BACKGROUND

The present disclosure relates generally to immersion photolithography and, more particularly, to an immersion photolithography system using a sealed wafer bath.

Immersion lithography is a relatively new advancement in photolithography, in which the exposure procedure is performed with a liquid filling the space between the surface of the wafer and the lens. Using immersion photolithography, higher numerical apertures can be built than when using lenses in air, resulting in improved resolution. Further, immersion provides enhanced depth-of-focus (DOF) for printing ever smaller features. It is understood that the present disclosure is not limited to immersion lithography, but immersion lithography provides an example of a semiconductor process that can benefit from the invention described in greater detail below.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to the liquid immersion photolithography systems, and, more particularly, to an immersion photolithography system using a sealed wafer bath. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Generally, there are two system configurations in immersion lithography, including lens-based ("LBC") systems and wafer-based ("WBC") systems. With LBC systems, immersion fluid is selectively applied to and extracted from a small region between the lens and the wafer and the immersion assembly is stationary with respect to the lens as the wafer is stepped or scanned.

Figure 1A:
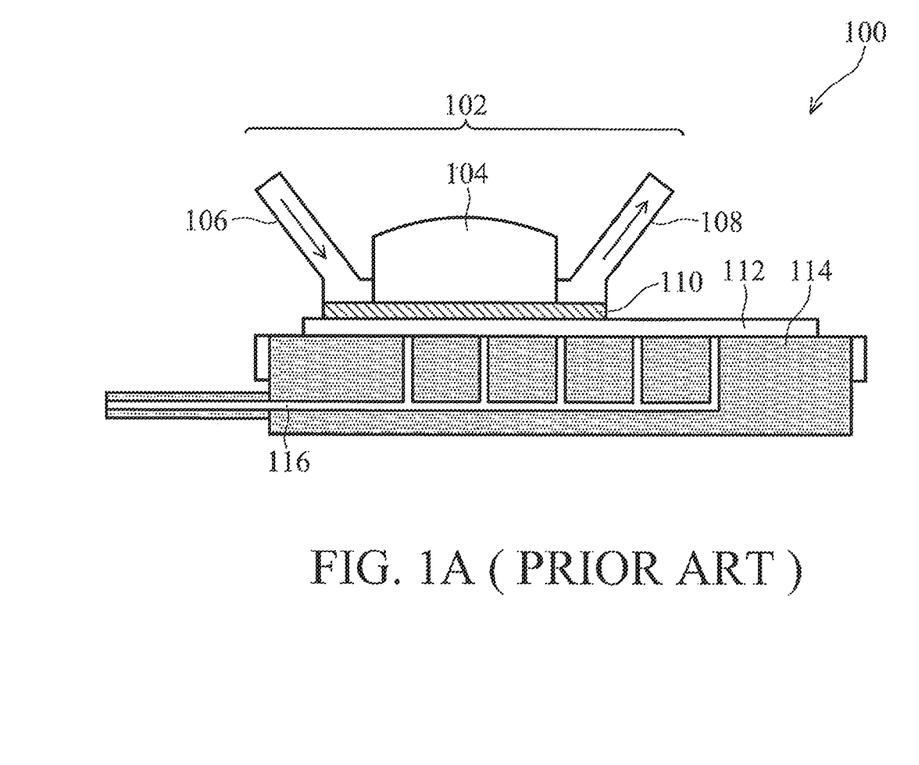
FIG. 1A illustrates an LBC immersion system.

Referring to FIG. 1A, a LBC system 100 includes an immersion head 102 comprising an imaging lens 104, a fluid inlet 106, and a fluid outlet 108. As shown in FIG. 1A, immersion fluid is disposed in an area 110 beneath the imaging lens 104 and above a wafer 112, which is secured to a wafer stage 114 via a vacuum system 116. Through the movement of the wafer stage 114 and the secured wafer 112, the fluid. The fluid is injected into the area 110 via the fluid inlet 106 and expelled via the fluid outlet 108, which process may result in fluid temperature control issues and fluid evaporation problems.

Advantages to LBC systems include the fact that the wafer stage thereof is essentially identical to that of a dry system, thereby saving development time and expense. Additionally, with LBC systems it is possible to maintain the same alignment, focus, and leveling setup as used in dry systems. Finally, with LBC systems, the volume of immersion fluid used is small, so that filling up the fluid-retaining cavity can be performed very quickly, thereby maintaining high wafer throughput volume.

Figure 1B:
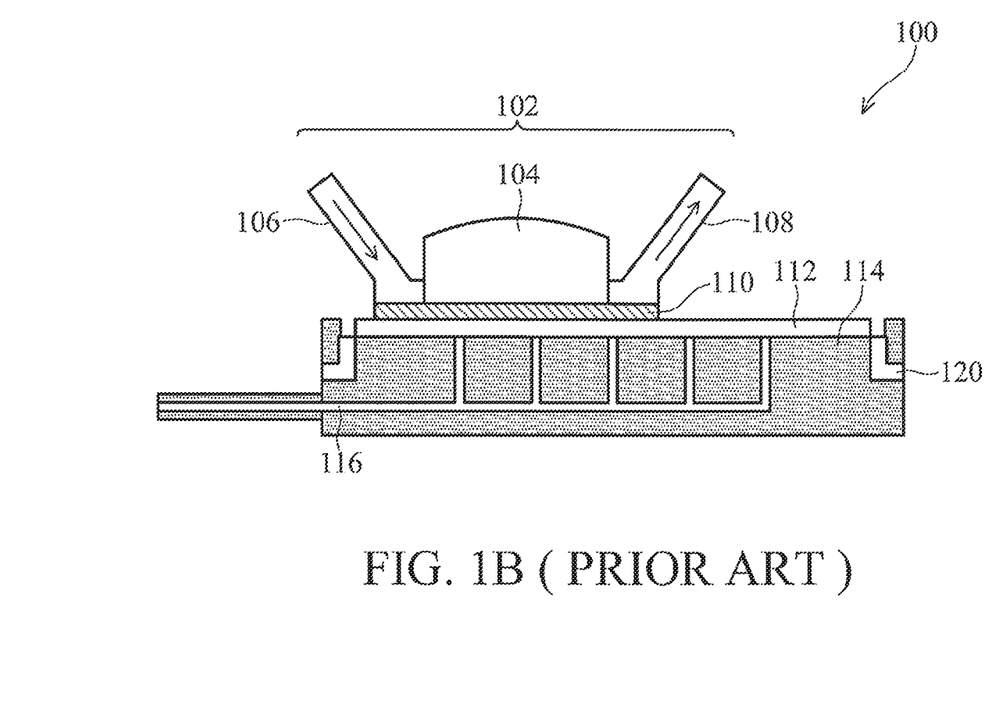
FIG. 1B illustrates an alternative design of an LBC immersion system.

Problems associated with LBC systems include the fact that, near the edge of the wafer, the immersion region includes the wafer and areas outside the chuck, such that maintaining the hydrodynamics in the fluid cavity and managing fluid extracting can be more difficult. Another problem is that particles at the backside of the wafer tend to be washed to the surface. Additionally, the LBC immersion head tends to leave trace amounts of fluid behind on the wafer surface as the wafer moves during the step-and-scan operation. This is a root cause of fluid stains on the wafer. Yet another problem associated with LBC systems is that the photoresist will have inconsistent fluid-contact history at different locations. Specifically, as the wafer is stepped from field to field, the neighboring fields, or parts thereof, are covered by fluid. This may occur to the same field multiple times and not necessarily in the same sequence or the same number of times for each field. Finally, in some LBC system designs, such as illustrated in FIG. 1B, immersion fluid flows over the wafer edge into a fluid drain 120 located along the edge of the wafer 112. While this reduces particle trapping, it results in wafer cooling at the edge, distorting the wafer and affecting overlay accuracy.

Figure 2:
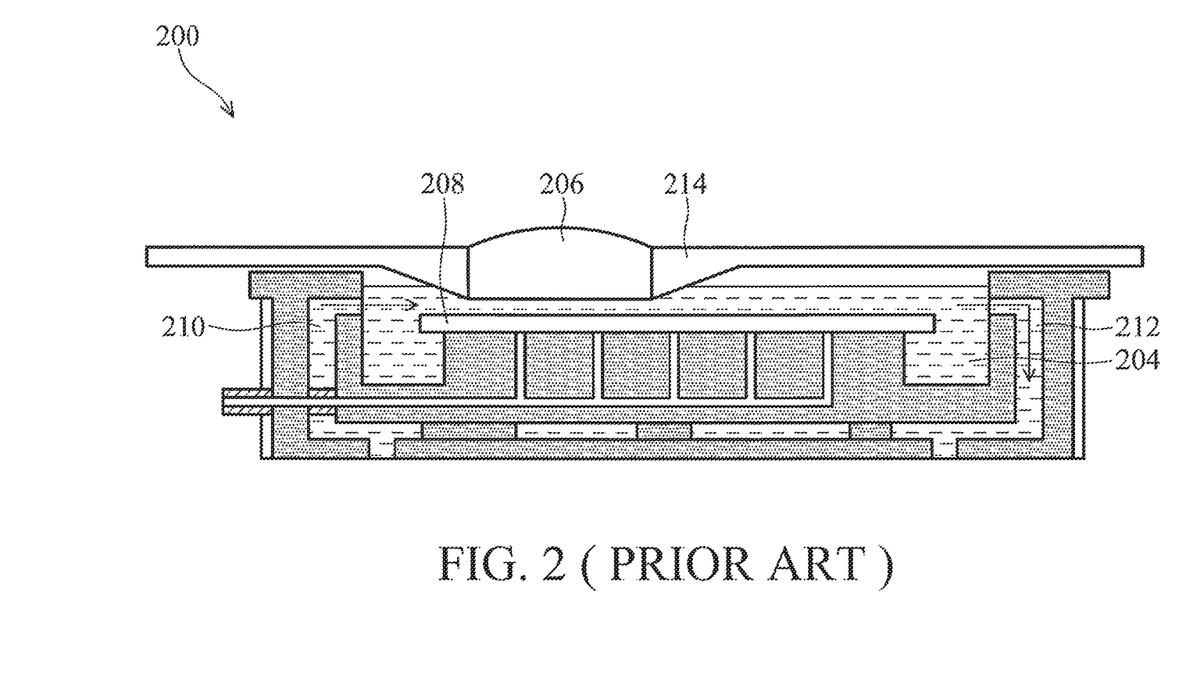
FIG. 2 illustrates a WBC immersion system.

Referring to FIG. 2, in contrast to LBC systems, in WBC systems, the wafer is completely immersed in immersion fluid in a circulating tank in the wafer stage. For example, in a WBC system 200, immersion fluid is selectively introduced into and expelled from a small region 204 between a lens 206 and a wafer 208 via a fluid inlet 210 and a fluid outlet 212. The immersion fluid circulates in the region 204 under and over the wafer stage continuously and is filtered and temperature-regulated as it moves across the surface area of the wafer 208. The fluid can be completely drained from the region 204 to allow for loading and unloading of the wafer 208. A cover 214 prevents immersion fluid 202 from spilling over and foreign particles from falling into the fluid.

Advantages of WBC systems include the fact that exposure at the edge of the wafer is the same as that at the center thereof. Moreover, each field contacts the wafer for the same amount of time. Additionally, there is no possibility of fluid stains caused by an immersion head and there is no issue of bubble generation from poor hydrodynamics near the edge of the wafer. WBC systems do, however, suffer certain deficiencies, including the fact that pre- and post-exposure soaking times of each exposure field are different. Moreover, it takes more effort or more time to fill and drain the immersion fluid and focusing, tilting, and alignment have to be performed in the immersion mode if twin stage is not used. Finally, substantial redesign of the wafer stage, as compared to a dry system, is necessary.

Two additional problems affect both LBC and WBC systems. These include the fact that the resist at the wafer edge within several millimeters (the "edge bead"), is usually removed because it is thicker than the rest of the resist coating. This leaves the possibility of broken resist fragments under the flushing of the fluid, thus contributing to particulate defects. Moreover, the fluid can seep into the underside of the wafer, making it a contamination source and susceptible for contamination as well. The evaporation of this fluid can contribute to uneven cooling and overlay errors.

Figure 3:
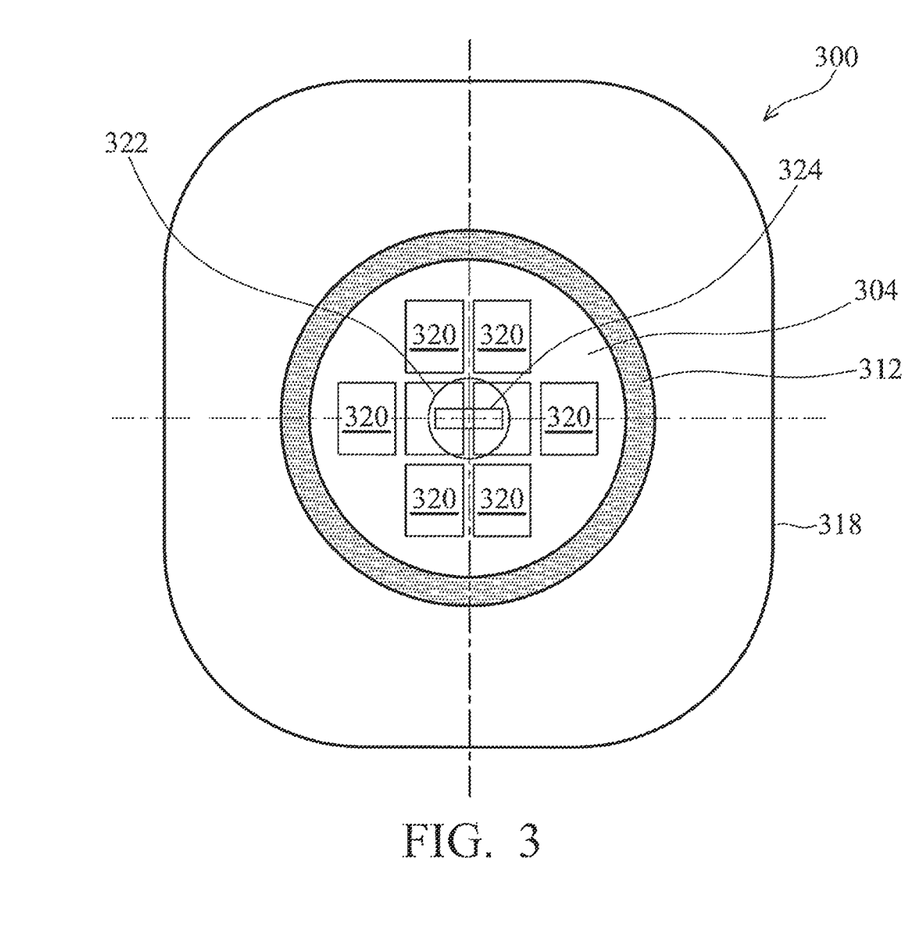
FIG. 3 illustrates a top view of a full immersion lithography system using a sealed wafer bath in accordance with one embodiment.
Figure 4:
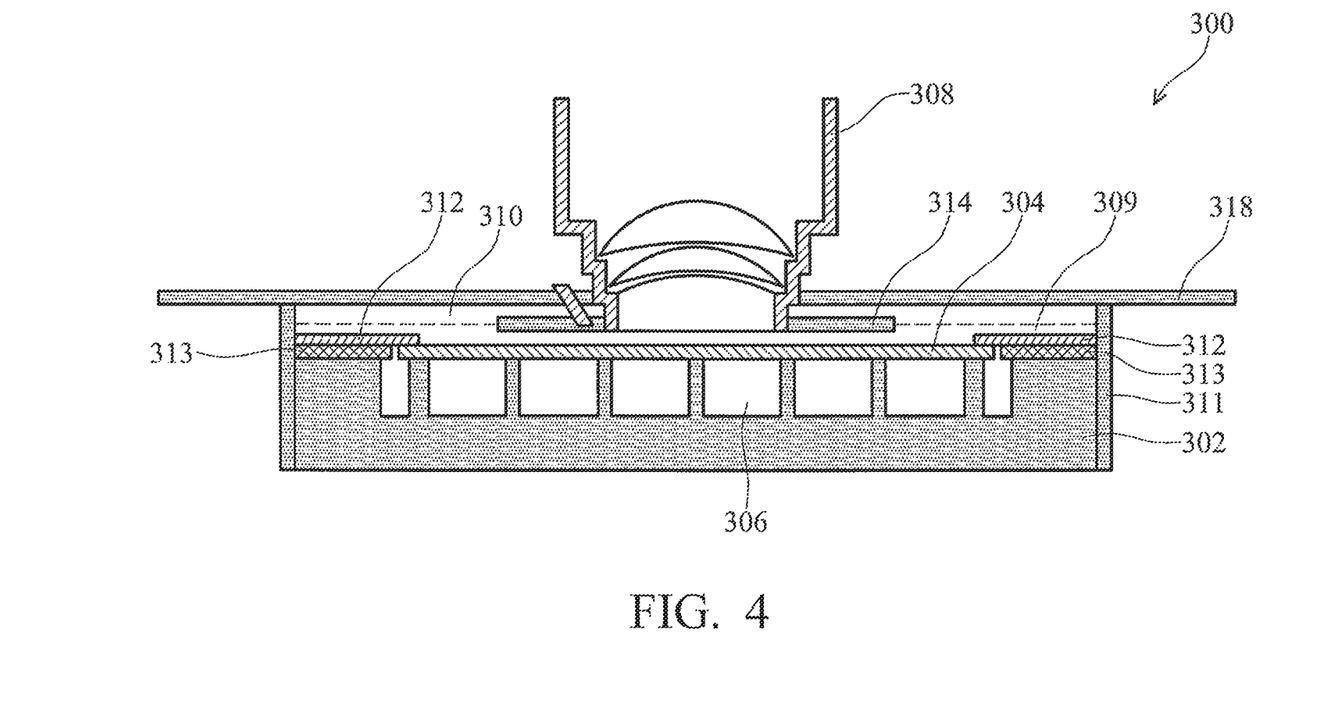
FIG. 4 illustrates a side view of the full immersion lithography system of FIG. 3.

Referring now to FIGS. 3 and 4, illustrated therein are top and side views of a full immersion lithography system 300 comprising a sealed bath in accordance with one embodiment. As best shown in FIG. 4, the system 300 comprises a wafer stage 302 to which a wafer 304 may be secured via a vacuum system 306. A lens assembly 308 is disposed over the wafer 304 and wafer stage 302. In accordance with one embodiment, immersion fluid 309 is disposed in an area, or tank, 310 over and around the wafer 304 between the wafer and the front surface of the lens assembly 308. The immersion fluid is retained within the tank 310 by a fluid retaining wall 311. In one embodiment, a refractive index of the immersion fluid is substantially 1.34. A seal ring 312 constructed of a thin flexible material such as Mylar, Teflon, rubber, etc. with thickness between a few micrometers and a few hundreds of micrometer is disposed on the wafer stage 302 via a seal ring frame 313 such that it contacts a top edge of the wafer 304 disposed on the stage. Suction created by the vacuum system 306 in a gap between the outer edge of the wafer 304 and the inner side of the seal ring frame 313 tightens the seal of the seal ring 312 to prevent leakage of immersion fluid 309 into the gap. The wafer 304 is moved under the lens assembly 308 for stepping and scanning.

A proximity cover 314 contacts the immersion fluid 309 in the area surrounding the lens assembly 308. The proximity cover 314 should be as large as possible; however, its size is limited by the existence of the fluid retaining wall 311 surrounding the tank 310. An enclosing cover 318 is attached to a lens column of the lens assembly 308 to enclose the tank 310 and create and maintain a fluid-vapor-rich environment therein. The enclosing cover 318 is larger than the fluid retaining wall 311, such that the area above the immersion fluid 309 is always enclosed at any wafer position.

Figure 5:
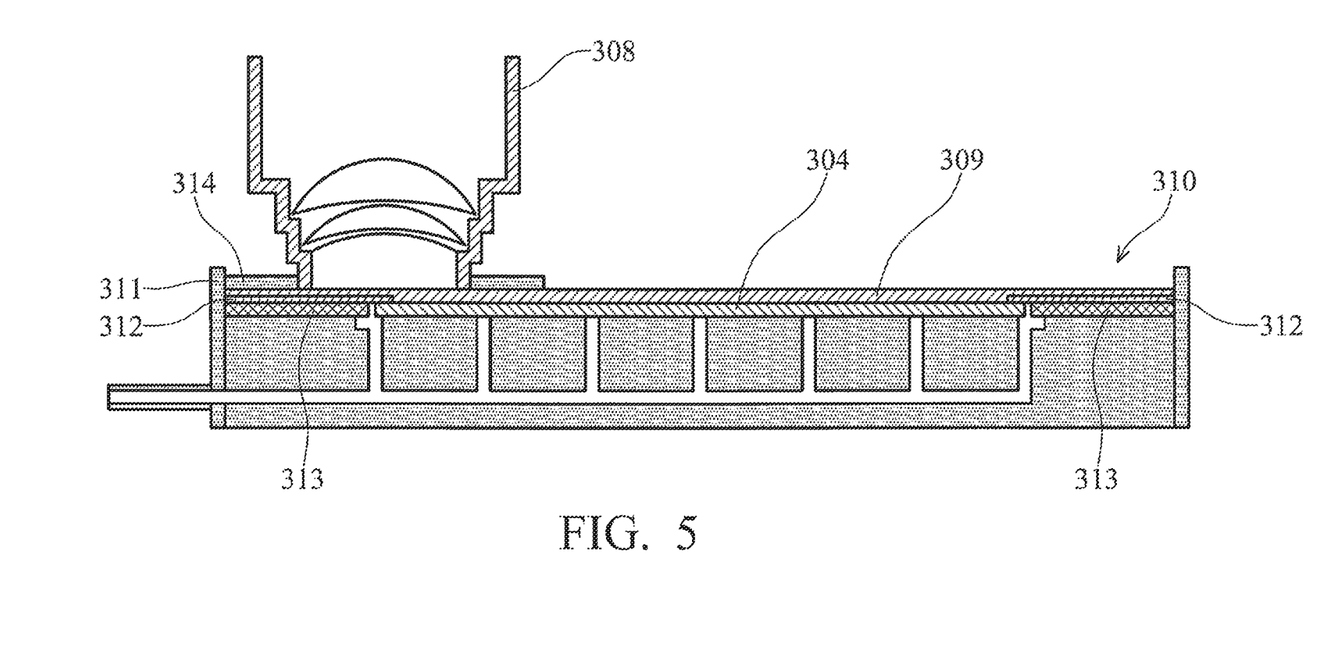
FIG. 5 is an enlarged side view of the full immersion lithography system of FIG. 3 showing a proximity cover thereof.
Figure 6:
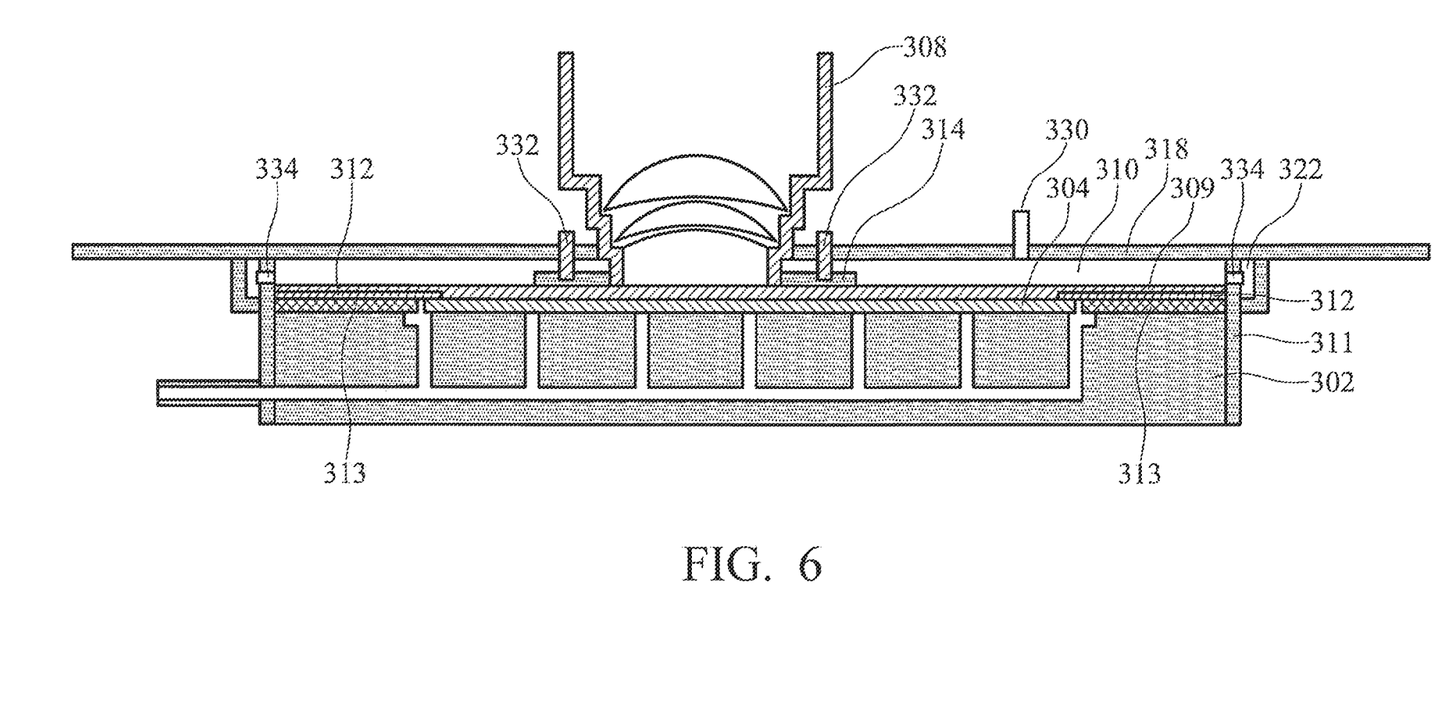
FIG. 6 illustrates the full immersion lithography system of FIG. 3 showing an enclosing cover thereof.

FIG. 3 best illustrates the relationship between the seal ring 312, the wafer 304, and the enclosing cover 318. As shown in FIG. 3, the wafer 304 comprises a plurality of scanned fields 320. A region 322 represents a lens field of the lens assembly 308. A slot 324 is also provided. The scan field is restricted to the area of slot 324. It will be recognized that the size of the proximity cover 314 should allow for the lens assembly 308, and particularly the lens slot 324 to be positioned as close as necessary to the edge of the wafer 304, as restricted by the existence of the fluid retaining wall 311. FIG. 5 illustrates positioning of the lens assembly 308 with the proximity cover 314 proximate an edge of the wafer 304. The enclosing cover 318 is provided for preventing evaporation of the immersion fluid 309. As best illustrated in FIG. 6, the enclosing cover 318 slows the escape of fluid vapor to reduce cooling due to fluid evaporation. A fluid-vapor-rich environment is provided to prevent fluid evaporation. Saturated vapor can be introduced into the area 310 enclosed by the enclosing cover 318, the wafer stage 302, and the fluid retaining walls 311, preferably through a fluid vapor inlet 330 through the enclosing cover 318. Similarly, fluid is introduced to the area 310 via one or more fluid inlets 332. Overflow fluid flows out of the area 310 into a trench 334 surrounding the fluid retaining wall 311 via fluid overflow holes 336 disposed in the wall. The fluid collected in the trench 334 can be properly drained therefrom via any number of draining systems (not shown).

Figure 7:
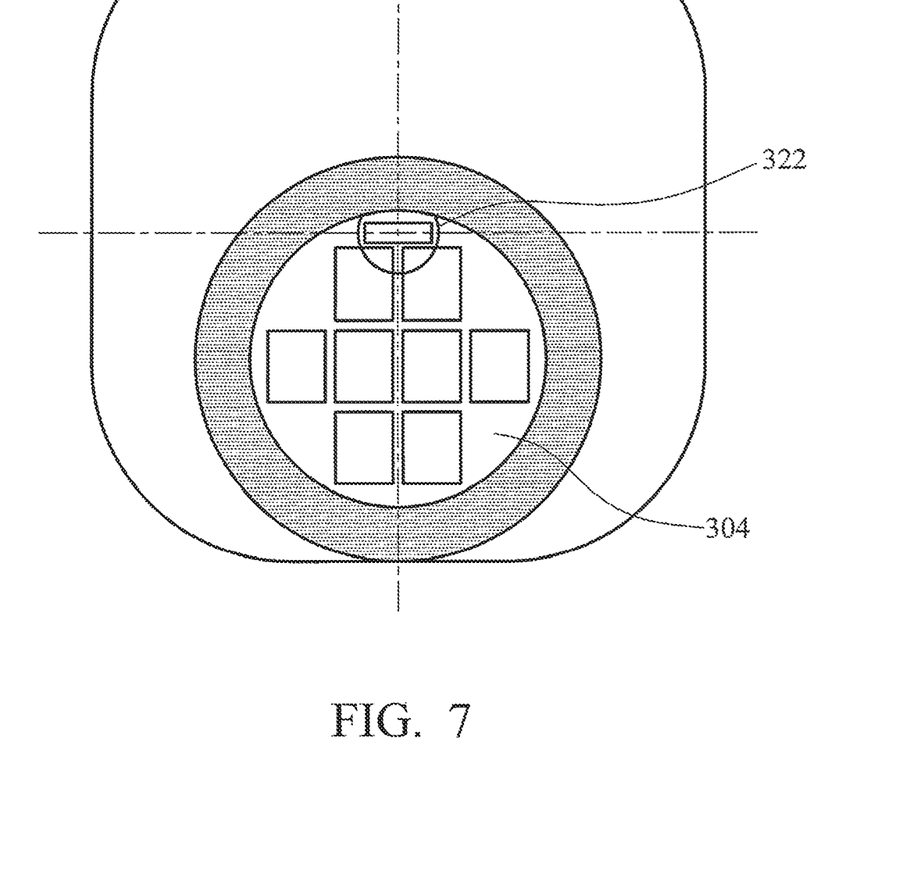
FIG. 7 illustrates a wafer at a position in which the lens field is disposed at the extreme topmost exposure position on the wafer.
Figure 8:
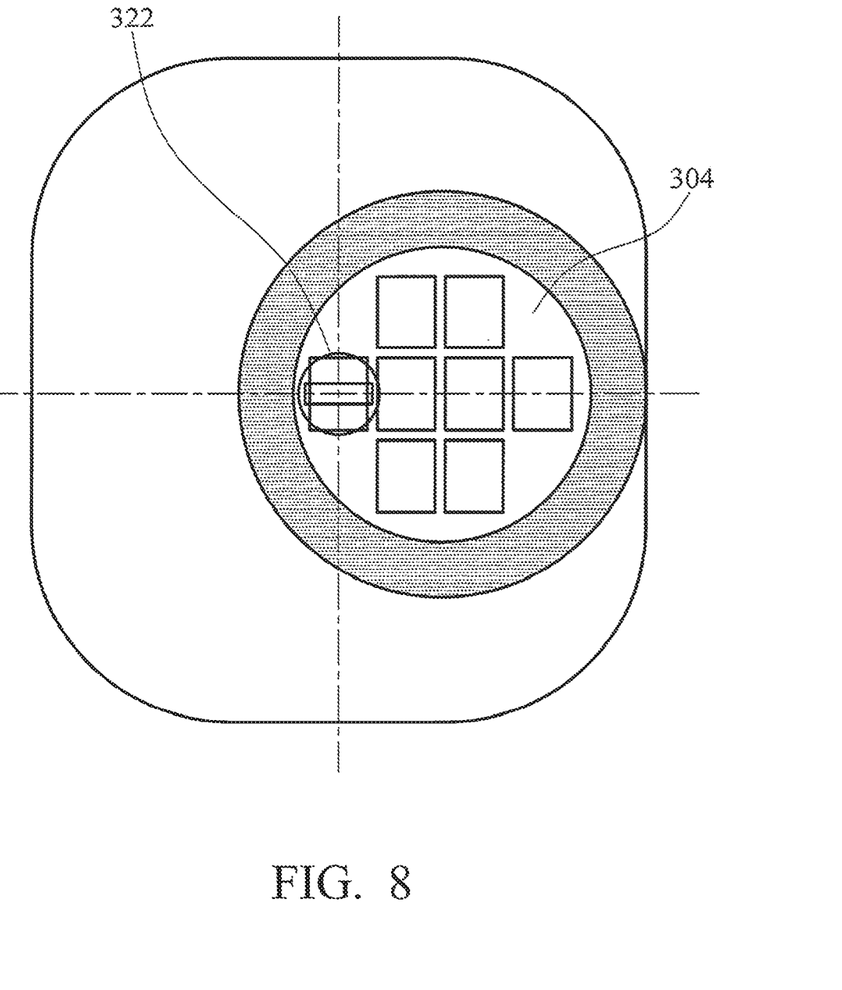
FIG. 8 illustrates a wafer at a position in which the lens field is disposed at the extreme leftmost exposure position on the wafer.

FIG. 7 illustrates the wafer 304 at a position in which the lens field 322 is disposed at the extreme topmost exposure position on the wafer. FIG. 8 illustrates the wafer at a position in which the lens field 322 is disposed at the extreme leftmost exposure position on the wafer.

Figure 9:
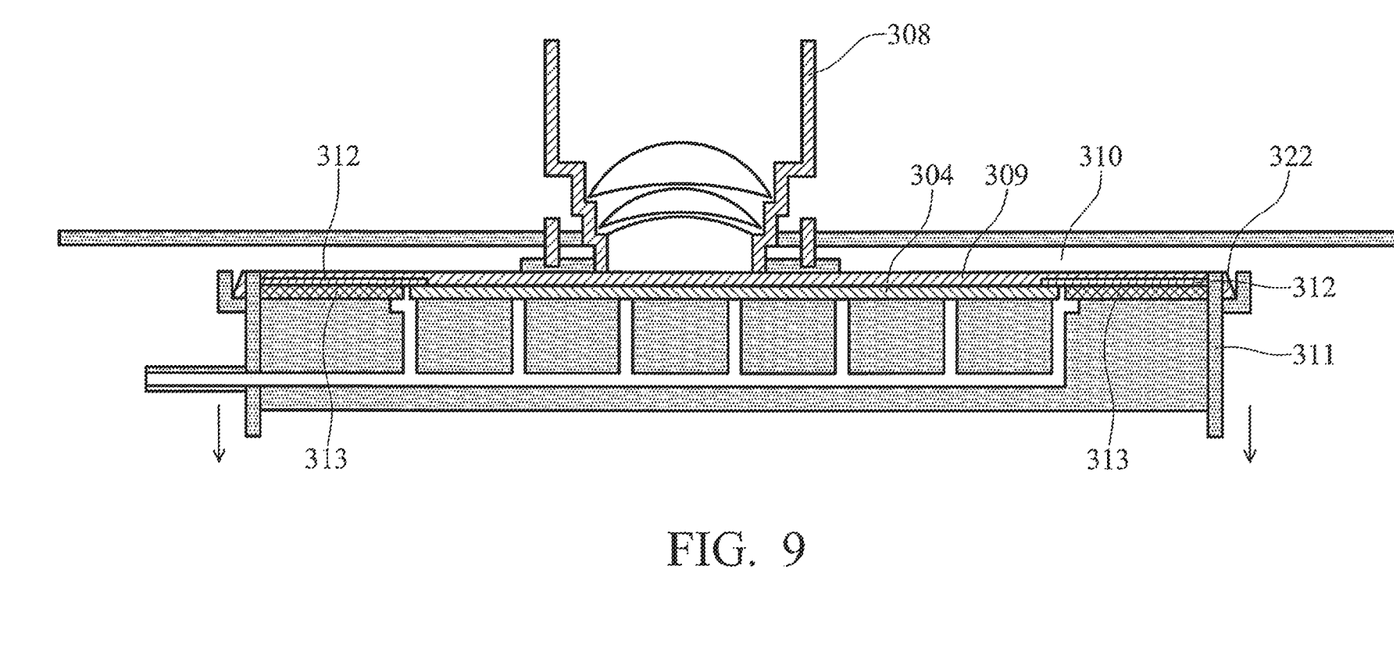
FIG. 9 illustrates the full immersion lithography system of FIG. 3 after the retaining wall thereof has been lowered to drain the immersion fluid therefrom.

In one embodiment, a loading sequence comprises raising the seal ring 312 and seal ring frame 313 using a vertically movable mechanism, after which the wafer 304 is lowered onto the wafer stage 302. In one embodiment, this may be accomplished by placing the wafer 304 onto three supporting pins surrounding the lens axis with a wafer-moving arm, which pins are lowered to drop the wafer onto the wafer stage. The seal ring assembly comprising the seal ring frame 313 and seal ring 312 is then lowered to seal the edge of the wafer 304. The wafer stage 302 is then moved to beneath the lens assembly 308, at which point the immersion fluid 309 and fluid vapor can be input into the tank 310. In one embodiment, vapor filling takes place first until complete saturation is achieved. The temperature of the fluid vapor, as well as that of the immersion fluid 309, should be regulated. The fluid vapor can be continuously fed to compensate for vapor loss through incomplete sealing of the area 310. In particular, a gap is intentionally left between the bottom of enclosing cover 318 and the top edge of the fluid retaining wall 311 so that there is not friction as the wafer stage 302 moves with respect to the enclosing cover. Once the wafer 304 has been completely exposed, the fluid retaining wall 311 is lowered, as shown in FIG. 9, to allow the immersion fluid to flow out into the trench 332. A fluid drain (not shown) may also be provided for draining fluid from the area 310. Residual fluid can be dried with an air jet or air knife after the wafer 304 is moved away from beneath the lens assembly 308 to a wafer load/unload position or a wafer measurement position as in a twin-wafer-chuck scanner.

Figure 10:
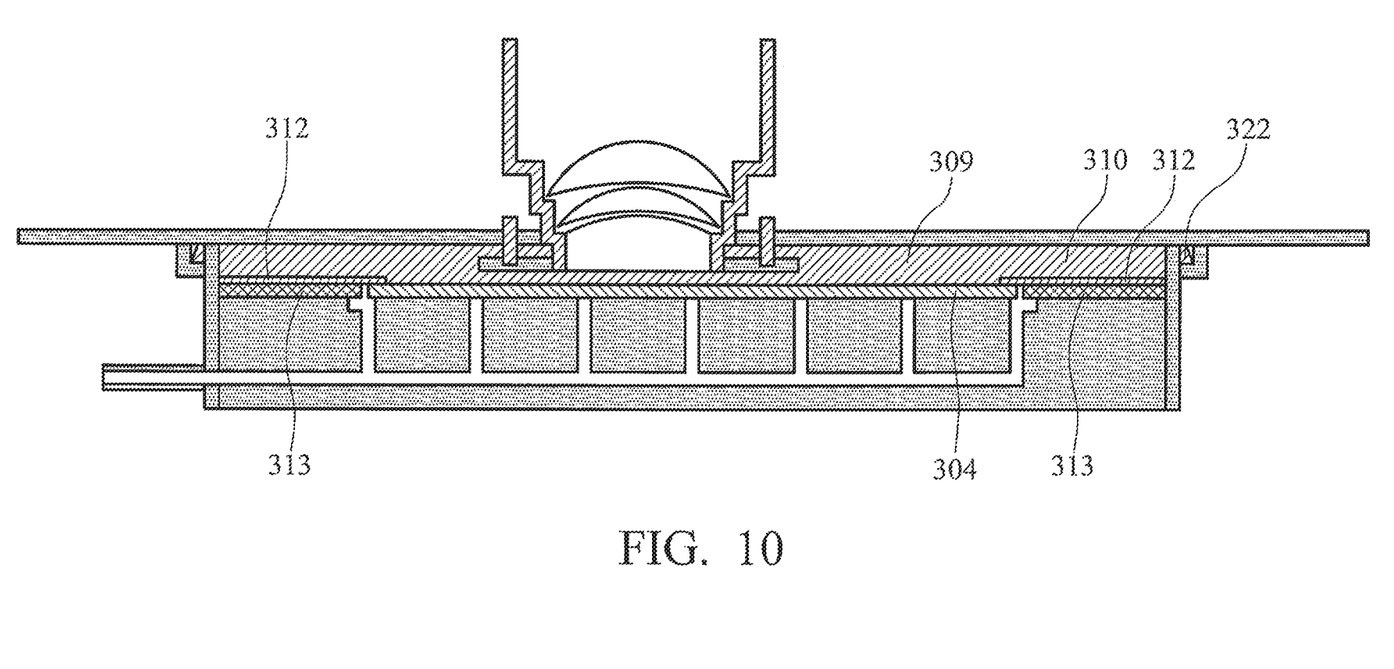
FIG. 10 illustrates an alternative arrangement of the full immersion lithography system of FIG. 3.

Alternately the entirety of the area 310 can be filled with immersion fluid can be filled with immersion fluid 309, as illustrated in FIG. 10. In this manner, there is no need to use saturated vapor to prevent fluid evaporation; however, the fluid must still be carefully temperature controlled. After the wafer 304 is exposed, the fluid can be removed from the tank 310 as described above with reference to FIG. 9.

Figure 11:
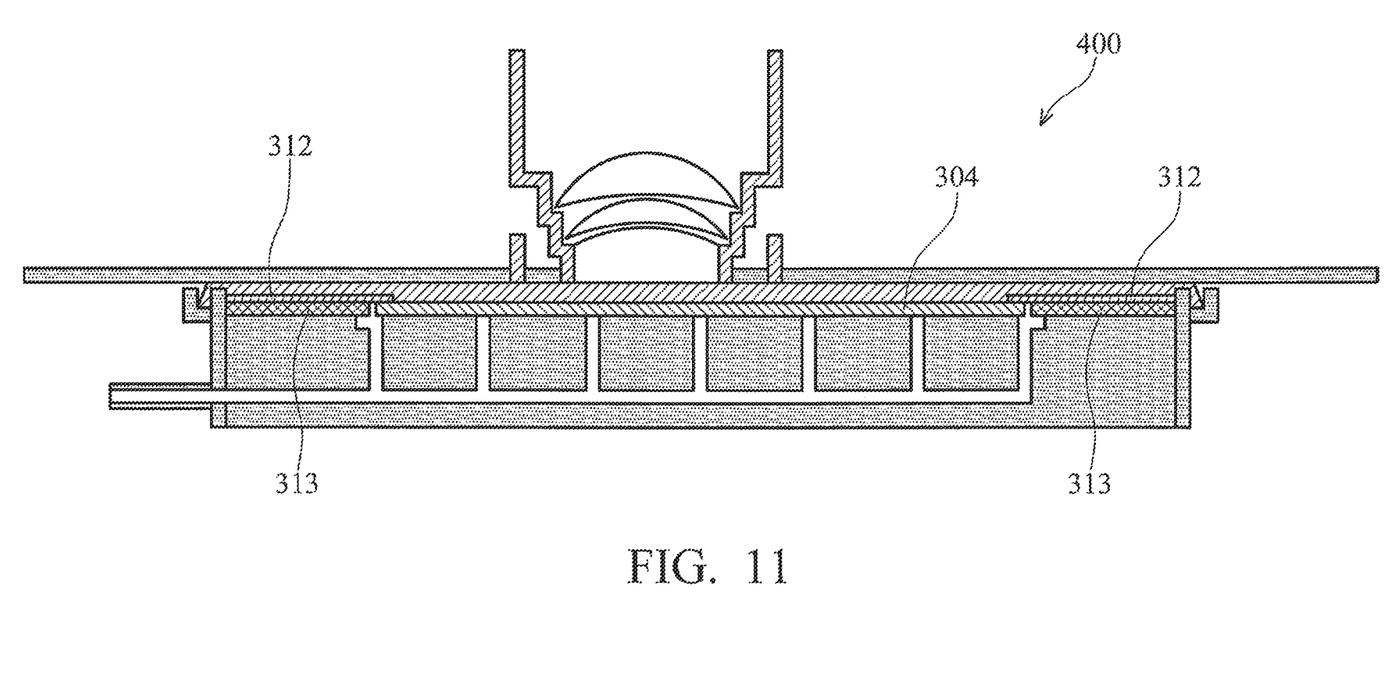
FIG. 11 illustrates a full immersion lithography system in accordance with another alternative embodiment.

FIG. 11 illustrates a full immersion lithography system 400 that differs from the system 300 in that it does not include a proximity cover. There is no need to induce a fluid-vapor-rich environment above the fluid in the system 400.

Figure 12:
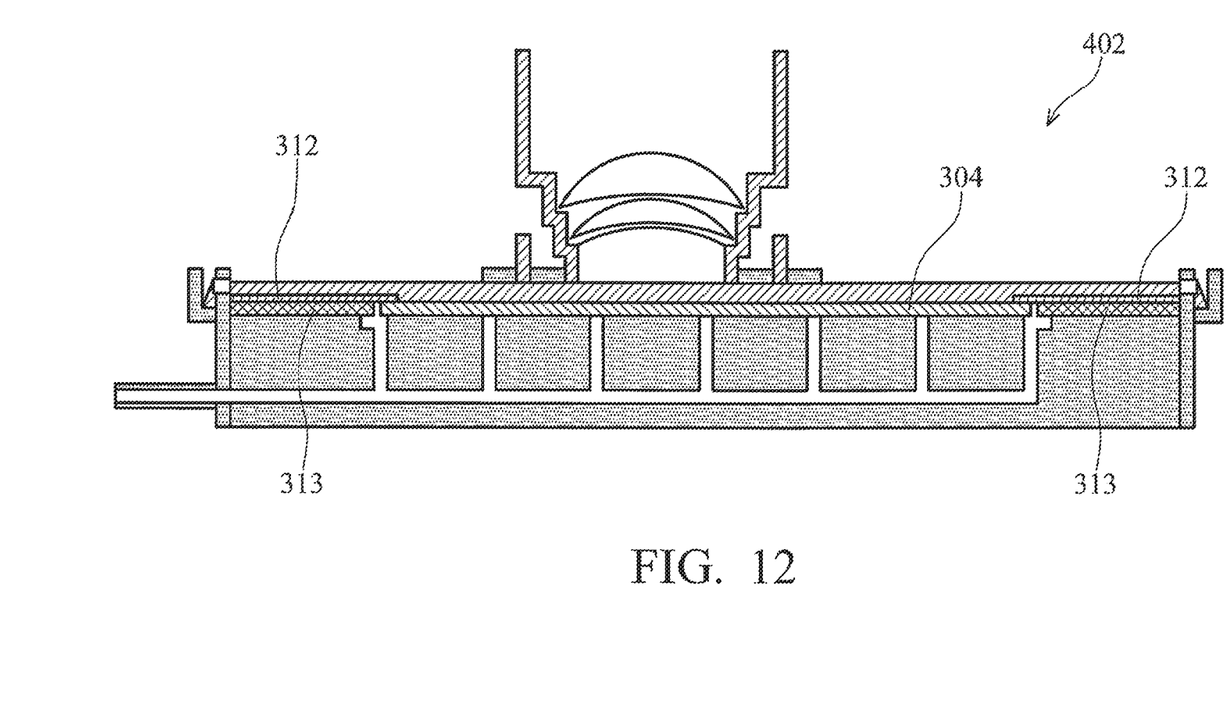
FIG. 12 illustrates a full immersion lithography system in accordance with yet another alternative embodiment.

FIG. 12 illustrates a full immersion lithography system 402 that differs from the system 300 in that it does not include an enclosing cover. The system 402 may be used so long as the stability and homogenity of the refractive index of the fluid within the proximity cover is acceptable.

Figure 13:
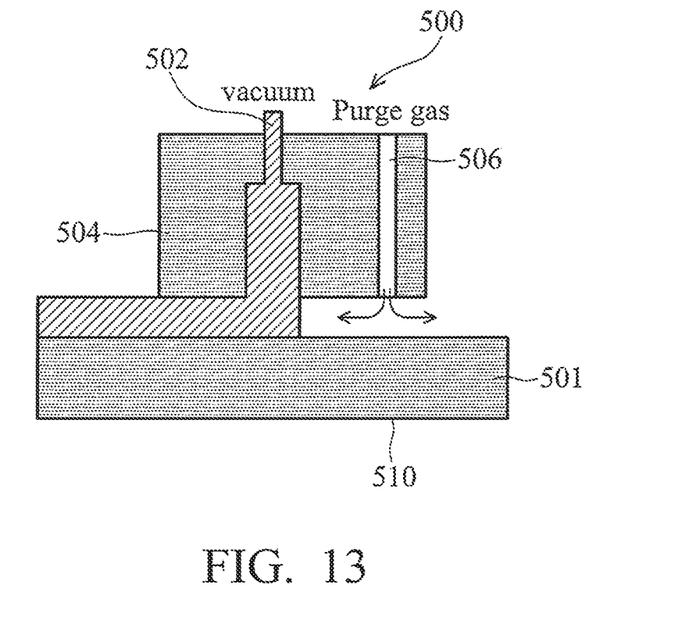
FIG. 13 illustrates a drying head for use in removing residual fluid from a wafer following exposure using a full immersion lithography process of one embodiment.

FIG. 13 illustrates a drying head 500 for use in removing residual fluid from a wafer 501 following exposure using a full immersion lithography process of one embodiment. As shown in FIG. 13, the drying head 500 includes at least one fluid vacuum outlet 502 for draining immersion fluid in a direction indicated by an arrow 504. Additionally, the head 500 includes a purge gas inlet 506 for introducing purge gas onto the surface of the wafer 501 as the wafer is moved underneath the head 500 in a direction indicated by an arrow 510. The combination of the removal of immersion fluid via the fluid vacuum outlet 502 and introduction of purge gas via the purge gas inlet 506 for drying the wafer 501 is highly effective in removing residual fluid therefrom.

As a result of the embodiments described herein, because the wafer is constantly under the immersion fluid until the exposure is complete, water stain is avoided. Moreover, the prevention of fluid evaporation ensures homogeneity to prevent water distortion affecting overlay accuracy. Finally, the seal ring reduces particles and prevents turbulence-induced bubbles. It also covers the wafer edge bead to prevent particle generation.

Although only a few exemplary embodiments of this invention have been described in detail above, those skilled in the art will readily appreciate that many modifications are possible in the exemplary embodiments without materially departing from the novel teachings and advantages of this invention.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. An apparatus comprising:
    a fluid container disposed over a wafer stage, the fluid container having a wall for retaining fluid over the wafer stage; and
    a lens assembly disposed over the wafer stage and extending into the fluid container, and
    wherein the wall of the fluid container is moveable with respect to another portion of the fluid container to allow the fluid to flow out of the fluid container while the lens assembly is disposed within the fluid container.

2. The apparatus of claim 1, further comprising a first cover coupled to the lens assembly and enclosing the fluid container when positioned in an enclosing position.

3. The apparatus of claim 2, wherein the first cover interfaces with the wall of fluid container when in the enclosing position.

4. The apparatus of claim 2, wherein the wall of the fluid container is moveable with respect to first cover thereby allowing the fluid to flow out of the container between the first cover and the wall of the fluid container.

5. The apparatus of claim 2, wherein the first cover includes an inlet configured to allow the fluid to flow into the fluid container.

6. The apparatus of claim 2, further comprising a second cover coupled to the lens assembly under the first cover, the second cover being disposed within the fluid contained when the first cover is positioned in the enclosing position.

7. The apparatus of claim 6, further comprising:
    a wafer disposed on the wafer stage;
    a seal ring disposed around the wafer stage and configure to secure the wafer to the wafer stage; and
    wherein a portion of the fluid is disposed between the second cover and the wafer when the first cover is positioned in the enclosing position.

8. An apparatus comprising:
    a fluid tank disposed on a wafer stage and having a first sidewall for retaining fluid;
    an imaging lens assembly disposed over the stage;
    an enclosing cover coupled to the imaging lens assembling and operable to enclose the fluid tank, and
    a fluid outlet disposed adjacent the fluid tank, wherein the first sidewall of the fluid tank is moveable with respect to the enclosing cover to allow the fluid to flow out of the fluid tank and into the fluid outlet.

9. The apparatus of claim 8, wherein the fluid tank further includes a second sidewall that opposes the first sidewall, wherein the second sidewall of the fluid tank is moveable with respect to the enclosing cover to allow the fluid to flow out of the fluid tank and into the fluid outlet.

10. The apparatus of claim 8, wherein the fluid interfaces with the enclosing cover when the enclosing cover encloses the fluid tank.

11. The apparatus of claim 8, wherein the fluid is spaced apart from the enclosing cover when the enclosing cover encloses the fluid tank.

12. The apparatus of claim 8, further comprising a vacuum system in communication with the wafer stage and configured to secure a wafer to the wafer stage via a vacuum force.

13. The apparatus of claim 8, wherein the fluid is an immersion lithography fluid.

14. The apparatus of claim 13, wherein the immersion lithography fluid has a refractive index of about 1.34.

15. The apparatus of claim 8, wherein the first sidewall of the fluid tank is configured to have a closed position and an open position, wherein when the first sidewall of the fluid tank is in the closed position the first sidewall retains fluid over the wafer stage and engages the enclosing cover, and wherein when the first sidewall of the fluid tank is in the open position the first sidewall is positioned to allow fluid to flow out of the fluid tank and into the fluid outlet, wherein the first sidewall is spaced apart from the enclosing cover when positioned in the open position.

16. A method comprising:

providing a fluid tank with fluid over a wafer;

positioning a lens assembly that includes an enclosing cover over the wafer such that the lens assembly is partially disposed within the fluid tank and the enclosing cover interfaces with a wall of the fluid tank;

exposing the wafer with the lens assembly; and moving the wall of the fluid tank with respect to the enclosing cover to allow the fluid to flow out of the fluid tank.

17. The method of claim 16, wherein the wafer is in communication with the fluid tank, and wherein providing the fluid tank with fluid over the wafer includes providing fluid directly on the wafer.

18. The method of claim 16, further comprising securing the wafer to a wafer stage via a seal ring prior to exposing the wafer with the lens assembly.

19. The method of claim 16, wherein a portion of the lens assembly is disposed within the fluid during the exposing of the wafer with the lens assembly, and wherein fluid is disposed extends from the portion of the lens assembly to the wafer during the exposing of the wafer with the lens assembly.

20. The method of claim 16, wherein the enclosing cover interfaces with the fluid during the exposing of the wafer with the lens assembly.

* * * * *